US006576515B2

(12) United States Patent
Chang

(10) Patent No.: US 6,576,515 B2
(45) Date of Patent: Jun. 10, 2003

(54) METHOD OF FORMING TRANSISTOR GATE

(75) Inventor: Ching-Yu Chang, Yilan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 15 days.

(21) Appl. No.: 09/727,154

(22) Filed: Nov. 30, 2000

(65) Prior Publication Data

US 2002/0063275 A1 May 30, 2002

(30) Foreign Application Priority Data

Sep. 26, 2000 (TW) ........................................ 89119795 A

(51) Int. Cl.⁷ ............................................. H01L 21/336
(52) U.S. Cl. ....................... 438/259; 438/257; 438/734
(58) Field of Search ................................. 438/201, 257, 438/259, 329, 243, 253, 260, 387, 734; FOR 203

(56) References Cited

U.S. PATENT DOCUMENTS 5,668,039 A * 9/1997 Lin ............................. 438/387

* cited by examiner

Primary Examiner—George Fourson
Assistant Examiner—Khiem D Nguyen
(74) Attorney, Agent, or Firm—J. C. Patent

(57) ABSTRACT

A method of forming a transistor gate. A substrate having a source/drain terminals, a gate dielectric layer, a lower section of a floating gate, a dielectric layer over the substrate is provided. The dielectric layer has an opening that exposes a portion of the upper surface of the lower section of the floating gate. A conductive material layer having slant exterior sidewalls is formed over the dielectric layer. The conductive material layer fills the via opening completely. A mask material layer is formed over the conductive layer. A mask material layer is formed over the conductive layer. A planarization is carried out to remove a portion of the mask material layer, thereby forming an etching mask layer that exposes the upper surface of the conductive layer. Using the etching mask layer as a mask, an anisotropic slant etching is carried out to etch the conductive layer to a predefined depth so that an opening in the upper section of the floating gate is formed. The etching mask layer is then removed. An inter-gate dielectric layer and a control gate layer are sequentially formed over the upper section of the floating gate to form a complete gate structure.

9 Claims, 11 Drawing Sheets

METHOD OF FORMING TRANSISTOR GATE

CROSS-REFERENCE TO RELATED APPLICATION

This application claims the priority benefit of Taiwan application serial no. 89119795, filed Sep. 26, 2000.

BACKGROUND OF THE INVENTION

1. Field of Invention

The present invention relates to a method of manufacturing semiconductor devices. More particularly, the present invention relates to a method of forming the gate of a stacked-gate non-volatile memory device such that effective area of the inter-gate dielectric layer (the dielectric layer between the control gate and the floating gate) inside the gate is increased.

2. Description of Related Art

All stacked-gate non-volatile memory such as erasable programmable read-only-memory (EPROM), electrically erasable programmable read-only-memory (EEPROM) and flash memory can hold data without the application of a voltage. Hence, stacked-gate non-volatile memory is ideal for storing frequently used and relatively permanent programs.

In general, the current-voltage characteristic of a stacked-gate non-volatile memory device can be inferred from the current-voltage characteristic and the capacitive coupling effects of a conventional metal-oxide-semiconductor device. Typically, the larger the capacitive coupling ratio of the non-volatile memory device, the lower will be the operating voltage required.

FIG. 1A is a diagram showing the layout of a conventional stacked-gate non-volatile flash memory device after the floating gate is patterned. FIG. 1B is a diagram showing the gate layout of the device shown in FIG. 1A. FIG. 2 is a cross-sectional diagram along line II–II' of FIG. 1B. As shown in FIGS. 1A and 1B, the layout includes a gate region 58 and a non-gate region 60. FIG. 2 is in fact a cross-sectional diagram showing details of the gate region 58 and neighboring region according to FIG. 1. As shown in FIG. 2, a gate structure is formed above a substrate. The substrate has a device structure therein. The device structure includes a semiconductor substrate 20, a source terminal 22 and a drain terminal 23. The gate structure includes a gate dielectric layer 24, a conductive layer 26, a conductive layer 50, a dielectric layer 52 and a conductive layer 54. The conductive layer 54 at least includes one layer. The gate dielectric layer 24 is a dielectric layer between the gate conductive layer 26 and the substrate 20. The conductive layer 26 and the conductive layer 50 together constitute a floating gate. The dielectric layer 52 is an inter-gate dielectric layer. The conductive layer 54 is a control gate.

A conventional stacked-gate type non-volatile flash memory device has altogether four contact capacitors. They are the contact capacitor $C_{FG}$ between the floating gate (the conductive layer 26 and the conductive layer 50) and the control gate (the conductive layer 54), the contact capacitor $C_B$ between the floating gate (the conductive layer 26 and the conductive layer 50) and the substrate (the semiconductor substrate 20), the contact capacitor $C_S$ between the floating gate (the conductive layer 26 and the conductive layer 50) and the source terminal 22 and the contact capacitor $C_D$ between the floating gate and the drain terminal 23.

The capacitive coupling ratio can be represented by the following formula:

$$\text{Capacitive coupling ratio} = \frac{C_{FG}}{C_{FG} + C_B + C_S + C_D}$$

According to the above formula, when the capacitance of the contact capacitor $C_{FG}$ between the floating gate (the conductive layer 26 and the conductive layer 50) and the control gate (the conductive layer 54) increases, the capacitive coupling ratio also increases.

In general, the capacitive coupling ratio can be increased by increasing the effective area of the inter-gate dielectric layer, lowering the thickness of the inter-gate dielectric layer and increasing the dielectric constant k of the inter-gate dielectric layer.

However, the inter-gate dielectric layer must have sufficient thickness to prevent electrons trapped inside the floating gate (the conductive layer 26 and the conductive layer 50) from entering into the control gate (the conductive layer 54) and resulting in device failure. On the other hand, increasing the dielectric constant of the inter-gate dielectric layer involves the use of new material and equipment for processing the material. Hence, the process cannot be easily implemented. Ultimately, the only option for increasing the capacitive coupling ratio falls back to increasing the effective surface area of the inter-gate dielectric layer so that the capacitance of the contact capacitance $C_{FG}$ between the floating gate (the conductive layer 26 and the conductive layer 50) and the control gate (the conductive layer 54) is increased.

However, as shown in FIG. 1A, 1B and 2, the conductive layer 50 is of the stacked-type. Hence, the increase in effective surface area is quite limited. Furthermore, when the dielectric layer 52 and the conductive layer 54 are patterned, the conductive layer 54 in the non-gate region 60, the dielectric layer 52, the conductive layer 50 and the conductive layer 26 must be removed simultaneously. Since the conductive layer 50 has a definite thickness, much thicker layer of the dielectric layer 52 needs to be removed by etching in the vertical direction than in the horizontal direction. Hence, some residues from the dielectric layer 52 are likely to remain.

In addition, signal storage in a dynamic random access memory is achieved through selectively charging and discharging of the capacitors on the surface of a semiconductor substrate. The execution of read/write operation is effected by moving electric charges into or away from a capacitor via a transfer field effect transistor connected to a bit line.

Capacitor is one of the principle components in a dynamic random access memory. Any reduction in capacitance accompanied by a reduction in memory cell area is likely to limit memory density. A reduction in memory cell capacitance will increase read-out difficulties and soft errors. Moreover, the use of low operating voltage may lead to large power consumption. An effective means of increasing capacitance is to increase the effective surface area of the dielectric layer between the upper and the lower electrode of a capacitor.

FIG. 3 is a cross-sectional view showing a conventional stack capacitor. As shown in FIG. 3, the stack capacitor includes a semiconductor substrate 80 having a device structure 82 therein. A dielectric layer 84 is above the semiconductor substrate 80 and the dielectric layer has a via opening 86 that exposes a portion of the device structure 82.

The stack capacitor also includes the lower electrode 88 of a conventional stack transistor. The lower electrode 88 fills the via opening 86 and covers a portion of the dielectric layer 84 around the via opening 86. The lower electrode 88 has a stacked-type profile. Due to shape limitation, such a lower electrode 88 only has moderate surface area.

A cylindrical capacitor has a greater surface area but processing demands more masking operations, and hence increases production time and complexity.

SUMMARY OF THE INVENTION

Accordingly, one object of the present invention is to provide a transistor gate structure and a method of forming the transistor gate capable of increasing effective surface area of the inter-gate dielectric layer inside a transistor gate and reducing etching thickness of the inter-gate dielectric layer in the vertical direction.

To achieve these and other advantages and in accordance with the purpose of the invention, as embodied and broadly described herein, the invention provides a method of forming a transistor gate. First, a gate dielectric layer is formed over a substrate. The lower section of a floating gate is formed over the gate dielectric layer. A source/drain region is formed in the substrate, one on each side of the lower section of the floating gate. A first dielectric layer is formed over the substrate. The first dielectric layer has a via opening that exposes the upper portion of the lower section of the floating gate. A conductive material layer is next formed over the first dielectric layer. The conductive material layer fills the via opening. The conductive material layer is patterned to expose the first dielectric layer outside the via opening, thereby forming a first conductive layer. The first conductive layer at least fills the via opening. The first conductive layer has a slant external sidewall. A mask material layer is formed covering the first conductive layer. A planarization is carried out to remove a portion of the mask material layer, thereby forming a first etching mask layer. The upper portion of the first conductive layer is also exposed after the planarization operation. Using the first etching mask layer as an etching mask, an anisotropic slant etching is carried out to etch the first conductive layer to a predefined depth so that the upper section of the floating gate is formed. The upper section of the floating gate has an upper section opening. The first etching mask layer is then removed.

In the aforementioned method, the first conductive layer has slant external sidewalls. The first etching mask layer covers the first dielectric layer not covered by the first conductive layer. Furthermore, the first etching mask layer completely covers the slant external sidewalls and the upper portion not covered by the first conductive layer. Hence, the first etching mask layer can serve as an etching mask in the anisotropic slant angle etching to form the upper section of the floating gate. Since there is no need to use a photomask to pattern the upper section of the floating gate, one photomask operation is saved.

In addition, since the upper section of the floating gate has an upper portion opening. The upper section of the floating gate has bigger area than a conventional stacked-type floating gate. Moreover, the upper section of the floating gate is formed by performing anisotropic slant angle etching of the first conductive layer having slant external sidewalls using the first etching mask layer as a mask. Ultimately, the upper section of the floating gate has slant external and internal sidewalls.

After the first etching mask layer is removed, a second dielectric layer conformal to the profile of the upper section of the floating gate is formed. At least a second conductive layer is formed over the second dielectric layer. A patterned second etching mask layer is formed over the second conductive layer. The pattern runs across a portion of the upper section of the floating gate. Using the second etching mask layer as a mask, an anisotropic etching is conducted sequentially etching the second conductive layer, the second dielectric layer, the upper section of the floating gate and the lower section of the floating gate. Hence, a portion of the first dielectric layer and the gate dielectric layer under the lower section of the floating gate is exposed. After the second dielectric layer is etched, an inter-gate dielectric layer is formed above the upper section of the floating gate. After the second conductive layer is etched, a control gate structure layer is formed above the inter-gate dielectric layer. Finally, the second etching mask layer is removed.

In the aforementioned method, the inter-gate dielectric layer and the upper section of the floating gate are conformal. Therefore, effective surface area of the inter-gate dielectric layer is increased leading to better gate performance such as increasing the capacitance between the floating gate and the control gate.

In addition, the gate-forming method includes an anisotropic etching step to etch the inter-layer dielectric layer. Because the inter-gate dielectric layer has slant sidewalls similar to the one on the upper section of the floating gate, etching thickness in the vertical direction is reduced. Consequently, the process of removing inter-gate dielectric layer in the non-gate region is easier.

The first conductive layer includes a polysilicon layer. The conductive layer has slant external sidewalls forming an angle of between 60° to 90° with the horizontal. The first conductive layer covers, for example, the first dielectric layer around the via opening. The mask layer can be, for example, a photoresist layer, a spin-on glass layer, an oxide layer, a silicon nitride layer, an ion-containing oxide layer, an ion-containing silicon nitride layer, a boron-silicate glass layer or a silicon-oxygen containing organic layer. The planarization step can be carried out by back etching or chemical-mechanical polishing. The etching angle in the anisotropic etching step is between 60° to 90° with respect to the horizontal. The predefined depth is at least 30% of the thickness of the conductive layer, for example.

This invention also provides a transistor gate structure on a substrate. The substrate includes a source/drain terminal. The gate structure includes a gate dielectric layer above a portion of the substrate. A lower section of a floating gate is above the gate dielectric layer. A dielectric layer having a via opening that exposes the upper portion of the lower section of the floating gate is above the substrate. An upper section of the floating gate fills the via opening. The upper section and the lower section of the floating gate are electrically connected. The upper section of the floating gate has slant external sidewalls. The upper section of the floating gate further has an opening above the via opening. The upper section opening has slant interior sidewalls. The upper section opening of the floating gate has a pre-defined depth. A conformal inter-gate dielectric layer is above the upper section of the floating gate. A control gate is above the inter-gate dielectric layer.

In the aforementioned gate structure, the upper section of the floating gate has slant external sidewalls and the upper section opening of the floating gate has slant interior sidewalls. Hence, effective surface area in the upper section of the floating gate is increased. In addition, since the inter-gate dielectric layer is conformal to the profile of the upper section of the floating gate, effective surface area of the inter-gate dielectric layer is also increased. Moreover, the slant sidewalls render the removal of inter-gate dielectric layer in the non-gate region much easier. In brief, performance such as the capacitance between the floating gate and the control gate is increased due to the increase in effective surface area of the inter-gate dielectric layer.

Similarly, the method and structure of this invention can be applied to increase the capacitance of capacitor in a dynamic random access memory. In a dynamic random access memory capacitor, the inter-gate dielectric layer can be regarded as a capacitor dielectric layer, the floating gate can be regarded as a lower electrode while the control gate can be regarded as an upper electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
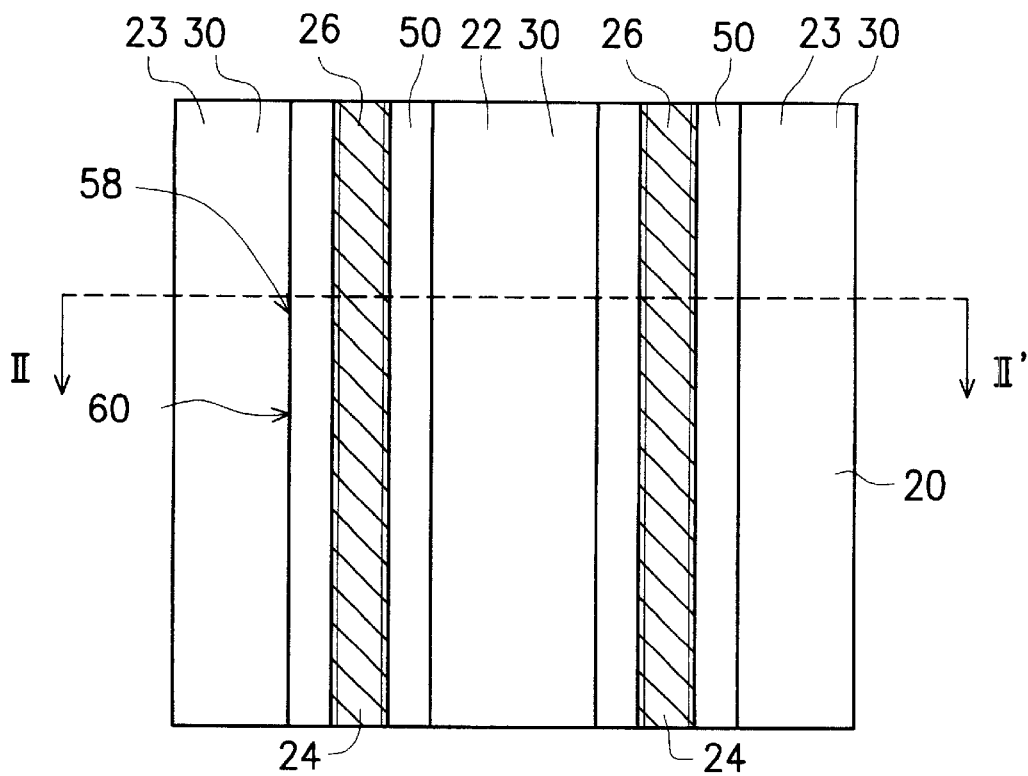
FIG. 1A is a diagram showing the layout of a conventional stacked-gate non-volatile flash memory device after the floating gate is patterned.
Figure 1B:
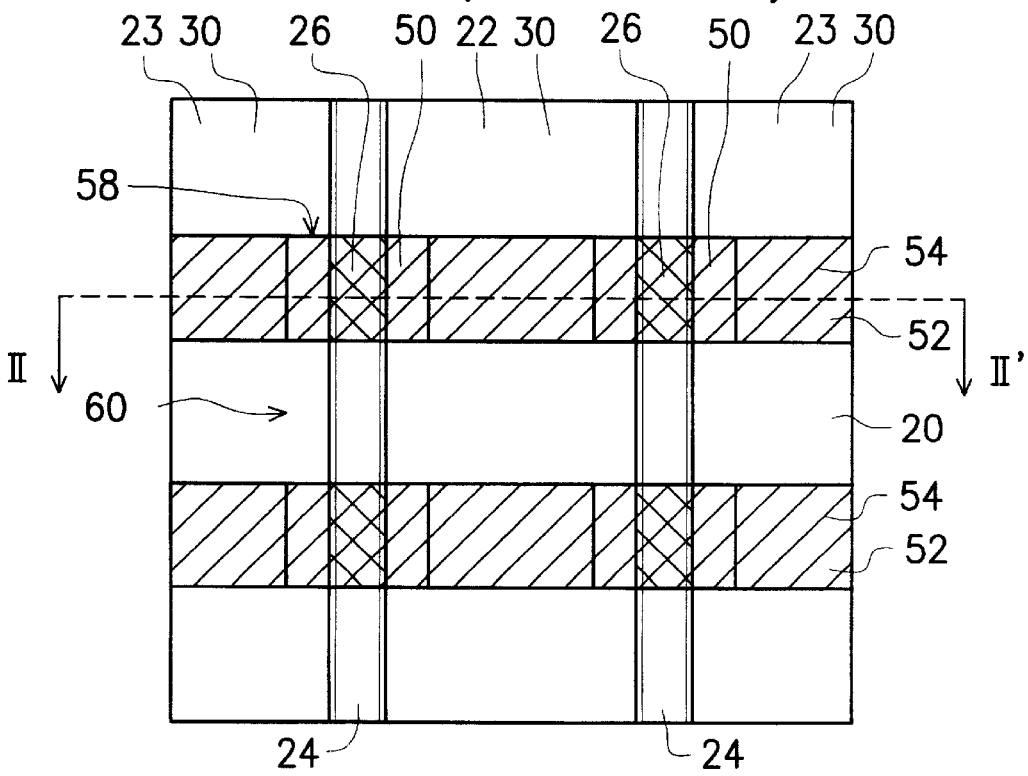
FIG. 1B is a diagram showing the gate layout of the device shown in FIG. 1A.
Figure 2:
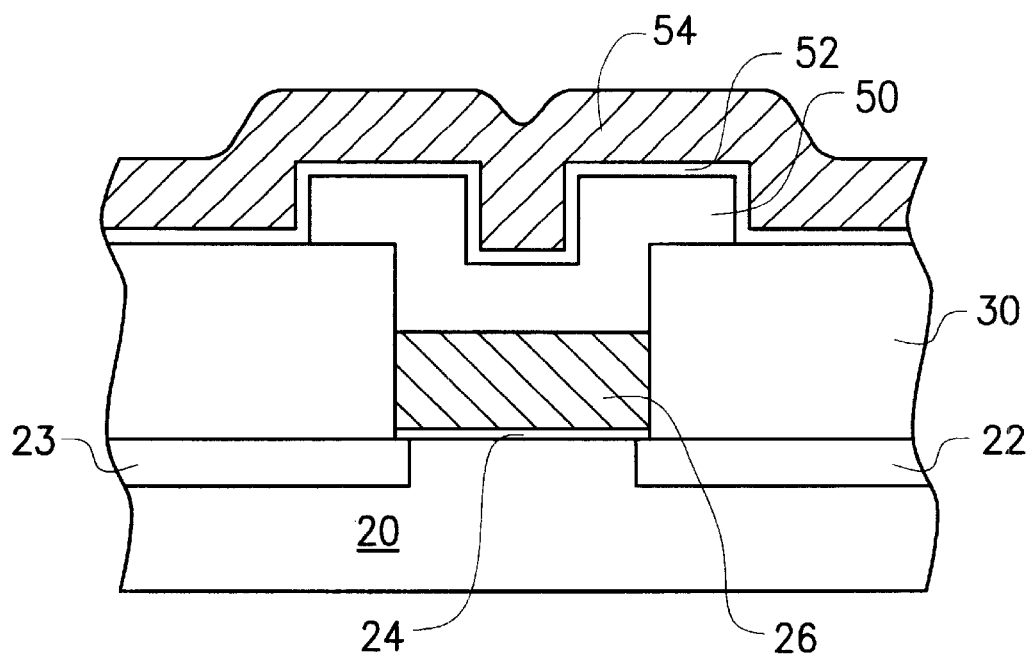
FIG. 2 is a cross-sectional diagram along line II–II' of FIG. 1B.
Figure 3:
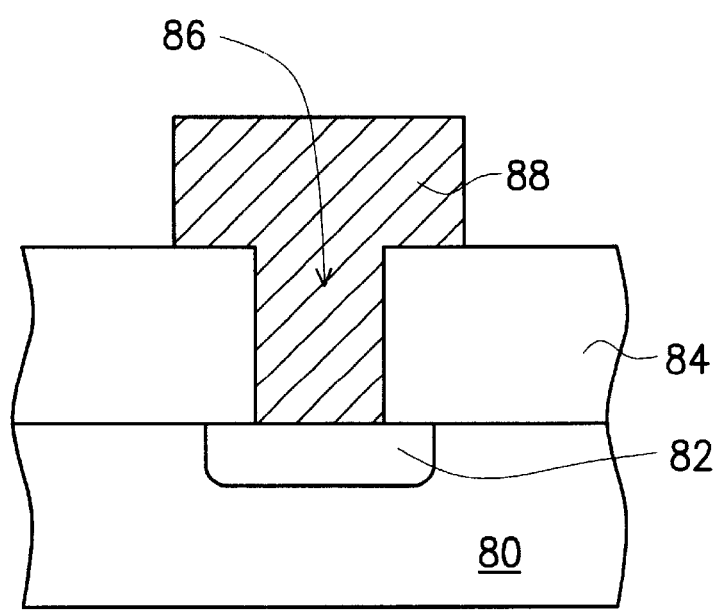
FIG. 3 is a cross-sectional view showing a conventional stack capacitor.

Reference will now be made in detail to the present preferred embodiments of the invention, examples of which are illustrated in the accompanying drawings. Wherever possible, the same reference numbers are used in the drawings and the description to refer to the same or like parts.

This invention provides a stacked-gate non-volatile memory device gate structure and its method of manufacture. The method includes forming a floating gate having a special upper section. The upper section of the floating gate has slant external sidewalls and an opening with slant interior sidewalls. Hence, the upper section of the floating gate has both slant external sidewalls and interior sidewalls.

Figure 4A:
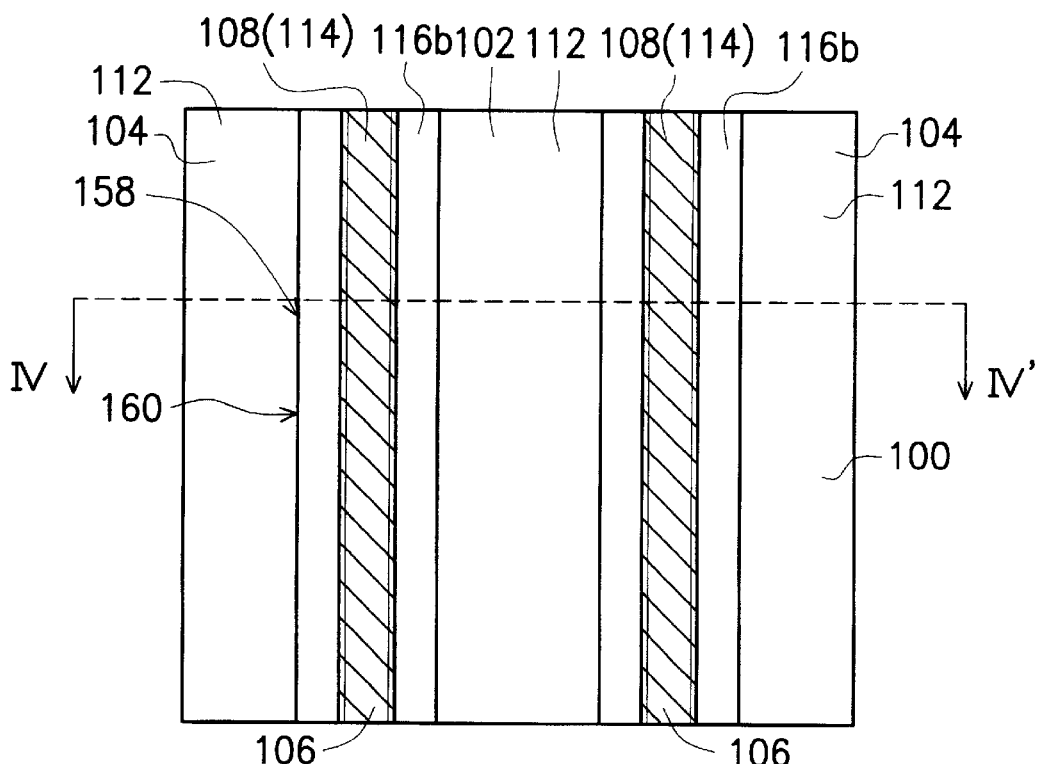
FIG. 4A is a diagram showing the layout of a stacked-gate memory device after the floating gate is patterned according to one preferred embodiment of this invention.

FIG. 4A is a diagram showing the layout of a stacked-gate memory device after the floating gate is patterned according to one preferred embodiment of this invention. As shown in FIG. 4A, conductive layer 108 and conductive layer 116b constitute the floating gate. Gate dielectric layer 106 is formed the dielectric layer between the floating gate and the substrate. Gate region 158 and non-gate region 160 have identical structure.

Figure 4B:
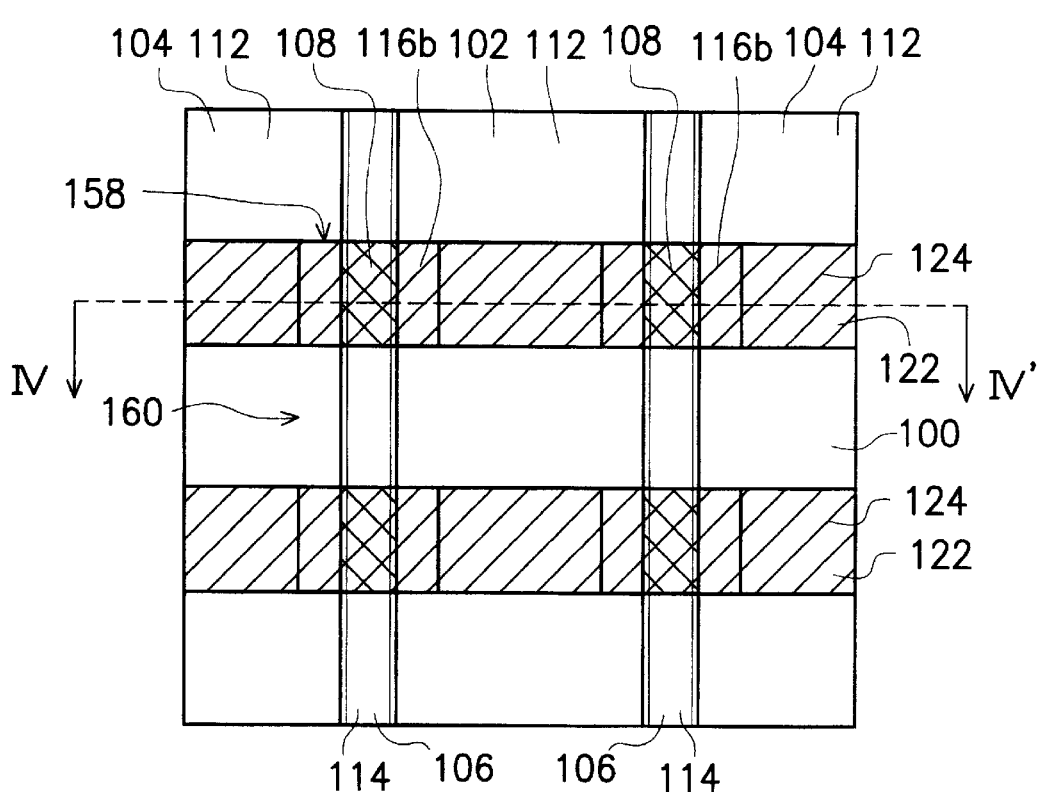
FIG. 4B is a diagram showing the gate layout of the device shown in FIG. 4A.

FIG. 4B is a diagram showing the gate layout of the device shown in FIG. 4A. As shown in FIG. 4B, dielectric layer 122 is an inter-gate dielectric layer. Conductive layer 124 is a control gate. The conductive layer 124 includes at least one layer. The gate region 158 includes the gate dielectric layer 106, the conductive layer 108 and the conductive layer 116b, the dielectric layer 122 and the conductive layer 124. The conductive layers 108 and 116b in the non-gate region 160 are removed when the dielectric layer 122 and the conductive layer 124 are patterned. The conductive layer 124 in the gate region 158 forms a bit line (not labeled in the figure) linking with the gate.

FIGS. 5A through 5H are cross-sectional views along line IV–IV' of FIGS. 4A and 4B showing the progression of steps for producing the gate structure according to this invention.

Figure 5A:
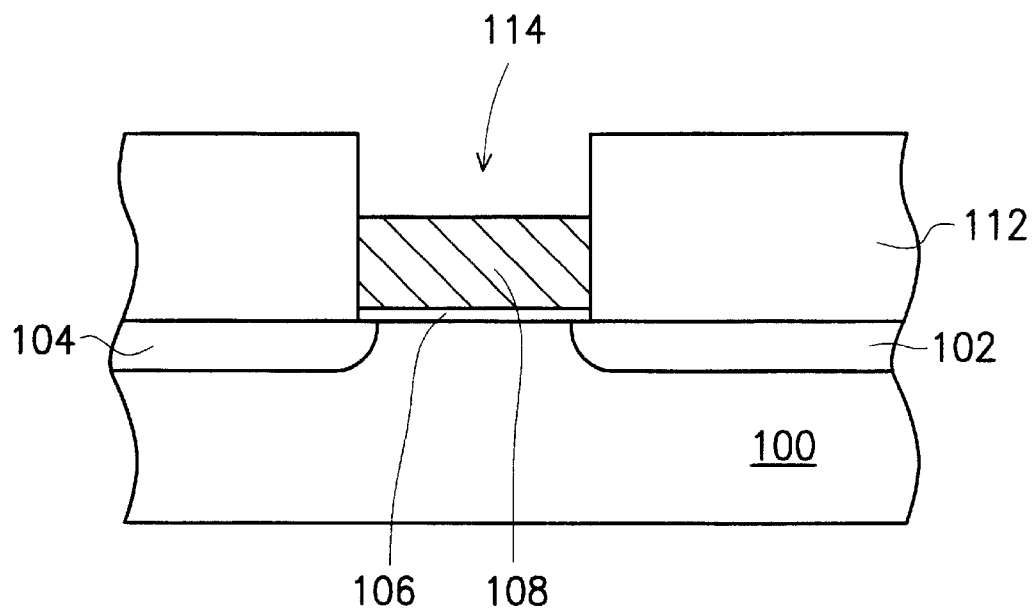
FIGS. 5A through 5H are cross-sectional views along line IV–IV' of FIGS. 4A and 4B showing the progression of steps for producing the gate structure according to this invention.

First, as shown in FIG. 5A, a semiconductor substrate 100 is provided. A source terminal 102 and a drain terminal 104 are formed in the substrate 100. A gate dielectric layer 106, a conductive layer 108 and a dielectric layer 112 higher than and surrounding the conductive layer 108 are sequentially formed above the substrate 100. The dielectric layer 112 also has a via opening 114.

Figure 5B:
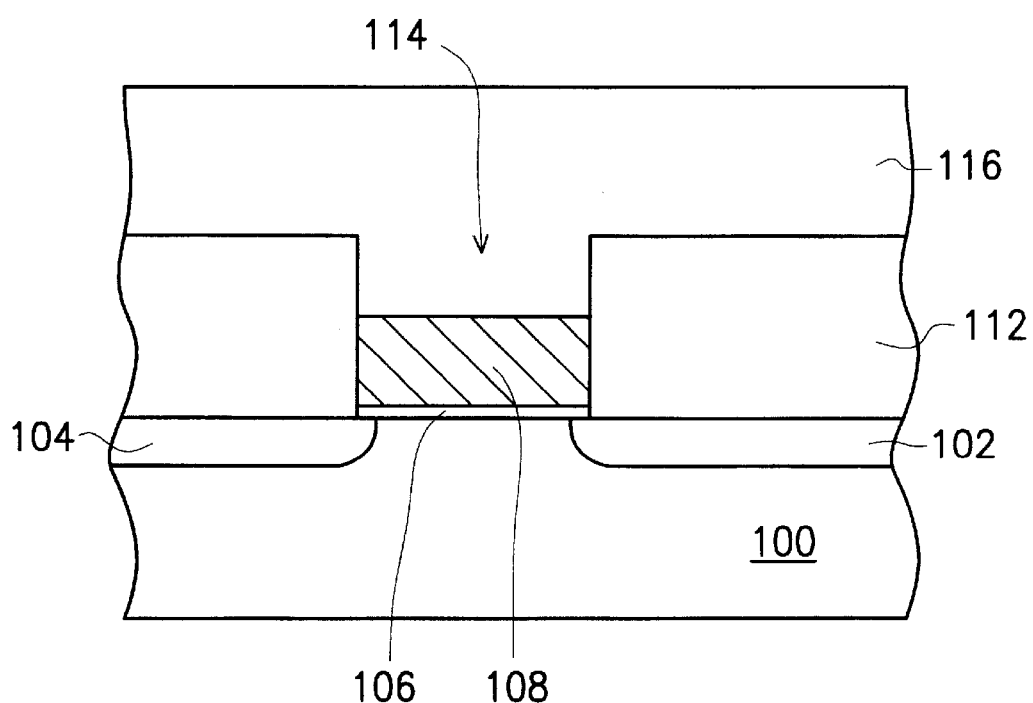

As shown in FIG. 5B, a conductive layer 116 is formed over the dielectric layer 112. The conductive layer 116 completely fills the opening 114. The conductive layer 116 can be a polysilicon layer, for example.

Figure 5C:
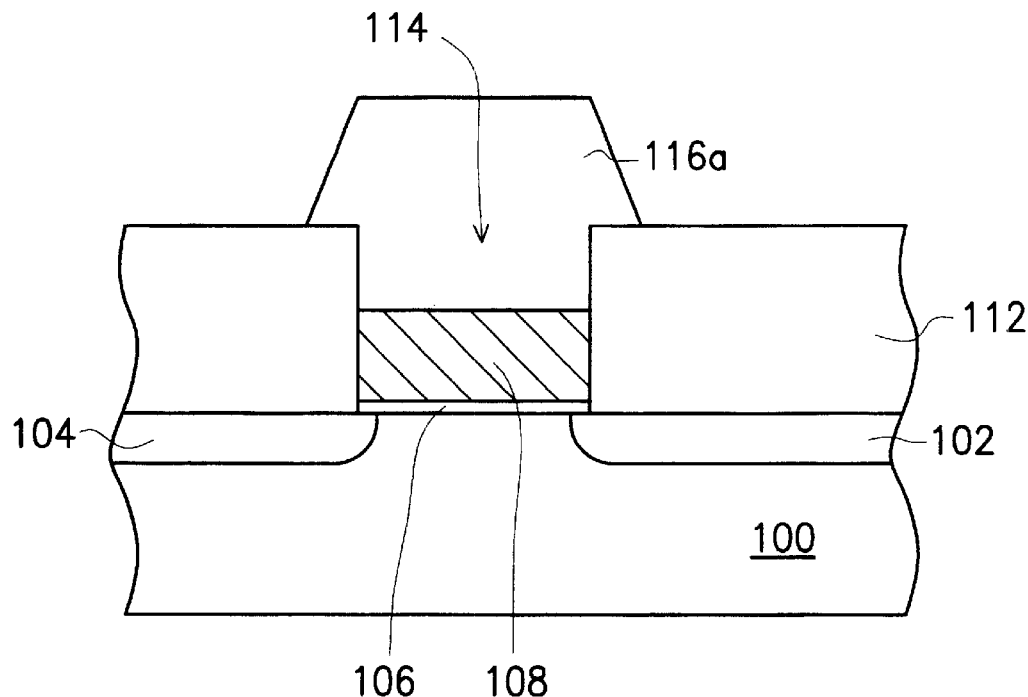

As shown in FIG. 5C, an etching mask layer similar to the layout of the conductive layer 116b in FIG. 4A is formed over the conductive layer 116. Using the etching mask layer as a mask, the conductive layer 116 is patterned so that the dielectric layer 112 lying outside the via opening 114 is exposed. Ultimately, a conductive layer 116a is formed. The conductive layer 116a at least fills the via opening 114 and has slant external sidewalls. The slant external sidewalls form an angle of between 60° to 90° with respect to a top surface of the dielectric layer 112. The conductive layer 116a may also covers a portion of the dielectric layer 112 round the via opening 114, for example.

Figure 5D:
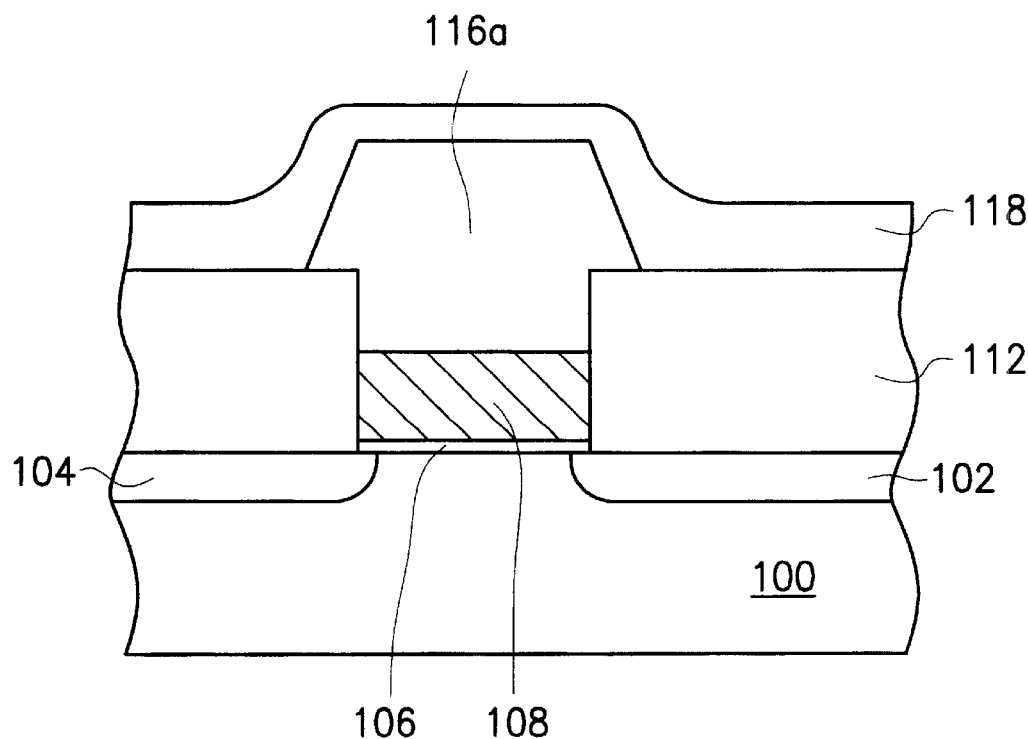

As shown in FIG. 5D, a mask layer 118 is formed over the conductive layer 116a. The mask layer can be, for example, a photoresist layer, a spin-on glass layer, an oxide layer, a silicon nitride layer, an ion-containing oxide layer, an ion-containing silicon nitride layer, a boron-silicate glass layer or a silicon-oxygen containing organic layer. If the mask layer is a spin-on glass layer, a densification step needs to be carried out after spin-coating the glass material onto the conductive layer 116a.

Figure 5E:
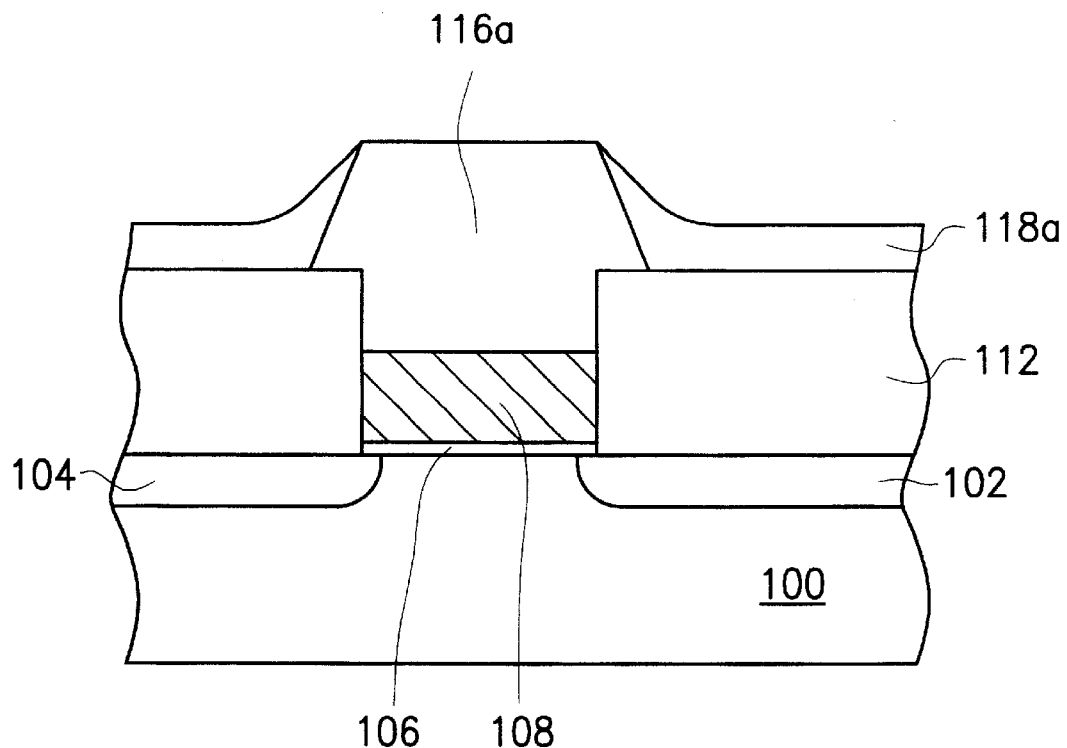

As shown in FIG. 5E, a portion of the mask layer 118 is removed by planarization to form a mask layer 118a. After the planarization, the upper surface of the conductive layer 116a is also exposed. The planarization step can be back etching or chemical-mechanical polishing. If the mask layer 118 is formed from one of the materials including oxide, silicon nitride, ion-containing oxide, ion-containing silicon nitride, boron-silicate glass, borophosphosilicate glass, boron-containing oxide, phosphorus-containing oxide, boron-phosphorus-containing oxide and silicon-oxygen organic silicate, back etching or chemical-mechanical polishing may be used to perform the planarization. On the other hand, if the mask layer 118 is a photoresist or a spin-on glass layer, back etching is preferably used to perform the planarization.

Figure 5F:
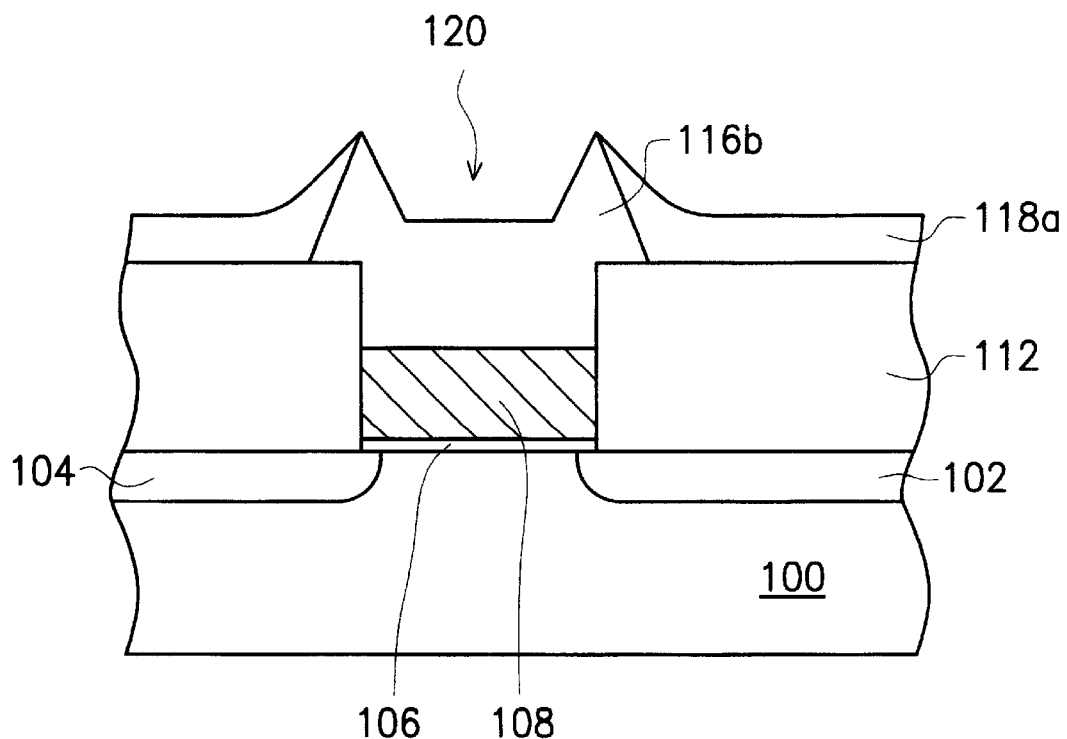

As shown in FIG. 5F, an anisotropic slant angle etching is carried out to etch the conductive layer 116a using the mask layer 118a as a mask to a pre-defined depth. Hence, an opening 120 is formed over the conductive layer 116b. The anisotropic slant angle etching produces interior sidewalls with a slant angle ranging between 60° to 90° with respect to the top surface of the dielectric layer 112. The pre-defined depth of the opening 120 is at least 30% of the thickness of the conductive layer 116b above the dielectric layer 112.

Figure 5G:
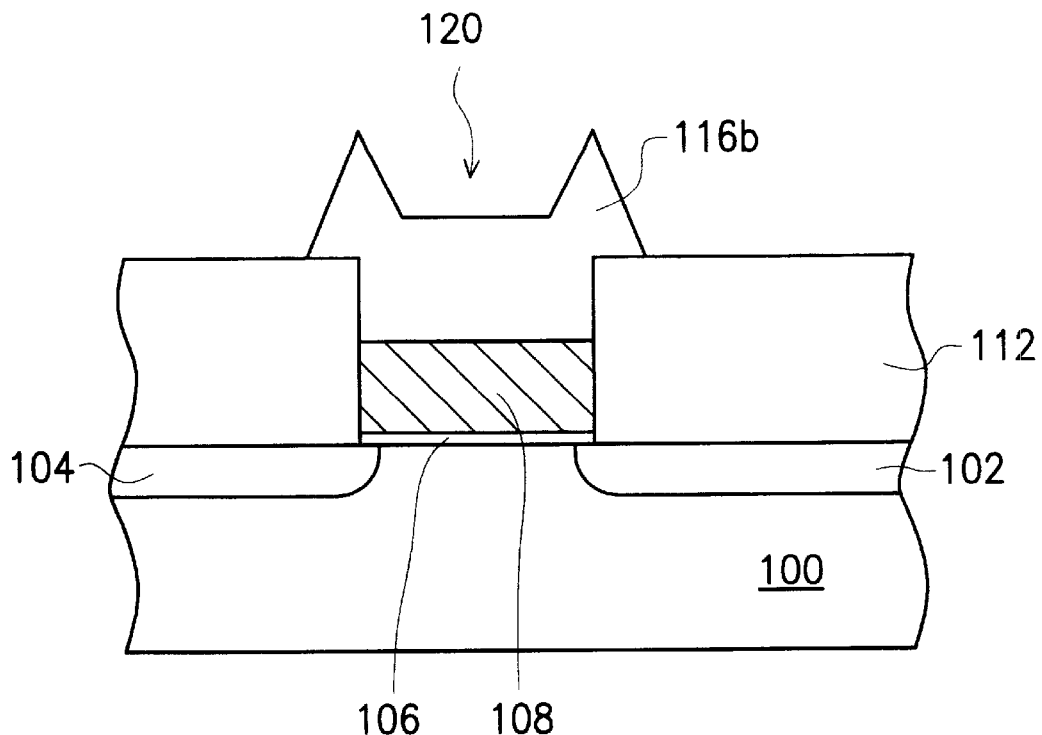

As shown in FIG. 5G, the mask layer 118a is removed to expose the conductive layer 116b. The exposed conductive layer 116b constitutes the upper section of the floating gate. The conductive layer 108 and the conductive layer 116b together form a complete floating gate structure. Layout of the conductive layers 108 and 116b is shown in FIG. 4A.

The conductive layer 116a has slant external sidewalls and the mask layer 118a covers the slant external sidewalls completely. Hence, the mask layer 118a can serve as a mask in the anisotropic slant edging operation to form the conductive layer 116b in the upper section of the floating gate without using another photomask to pattern the floating gate. A photomask fabrication step is thereby saved.

The conductive layer 50 in the floating gate of a conventional stacked-gate non-volatile device is shape-limited and hence the effective surface area is quite restricted. On the contrary, the conductive layer 116b shown in FIG. 5G has a conductive opening 120. Hence, effective surface area of the conductive layer 116b is increased.

Furthermore, the conductive layer 116b has slant external sidewalls formed by anisotropic slant etching of the conductive layer 116a. Hence, the opening 120 of the conductive layer 116b has slant interior sidewalls. In other words, the conductive layer 116b has both slant interior and exterior sidewalls.

Figure 5H:
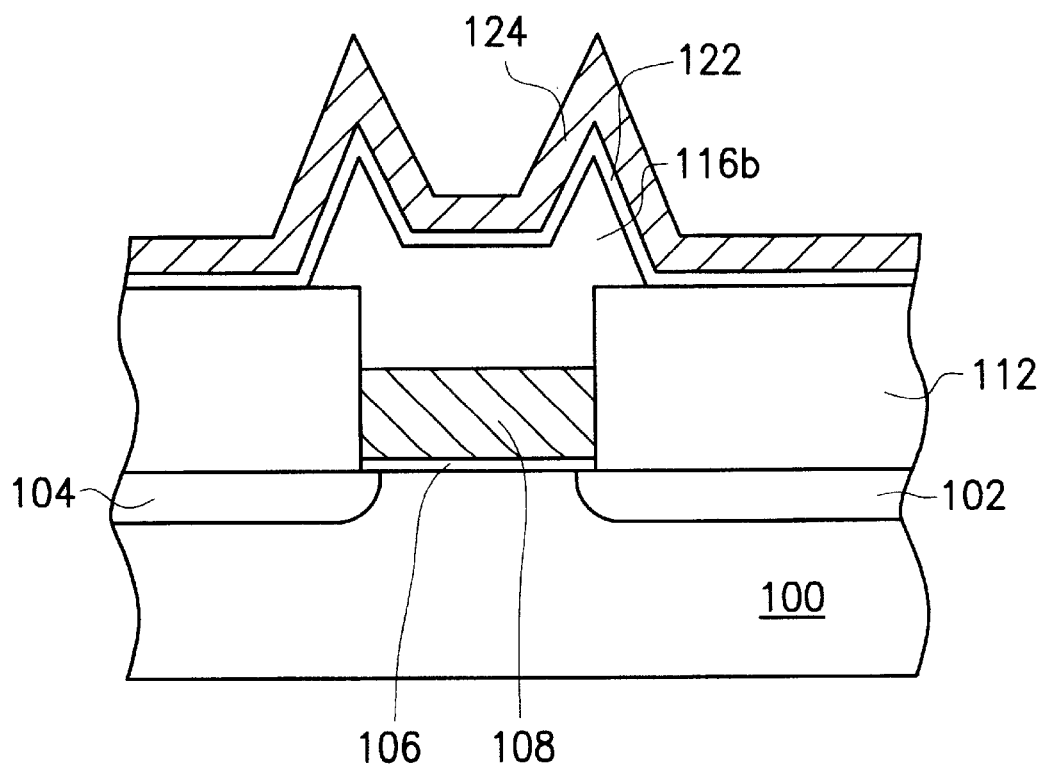

As shown in FIG. 5H a conformal inter-gate dielectric layer is formed over the conductive layer 116b and the dielectric layer 112. A control gate film is formed over the inter-gate dielectric layer. As shown in FIG. 4B, a conductive layer 124 and a dielectric layer 122 serving as an etching mask layer is formed over the control gate film. Using the etching mask layer (the conductive layer 124 layout shown in FIG. 4B), the control gate film in the non-gate region 160, the inter-gate dielectric layer, the conductive layer 116b and the conductive layer 108 are sequentially etched to expose the gate dielectric layer 106. In the meantime, the control gate film and inter-gate dielectric layer not covered by etching mask layer (the conductive layer 124 layout shown in FIG. 4B) round the non-gate region 160 are both etched to expose the dielectric layer 112. Thereafter, the etching mask layer (the conductive layer 124 layout shown in FIG. 4B) is removed to form the conductive layer 124 and the dielectric layer 122. Ultimately, a gate and a word line that links with the gate are formed in the gate region 158.

The dielectric layer 122 in the gate region 158 has a shape similar to the conductive layer 116b. Hence, effective surface area is increased. The dielectric layer 122 is the inter-gate dielectric layer while the conductive layer 124 is the control gate. Therefore, capacitance between the floating gate and the control gate is increased.

Since the inter-gate dielectric layer is conformal to the conductive layer 116b, the inter-gate dielectric layer in the non-gate region 160 has an identical shape as the conductive layer 116b. Because the conductive layer 116b has slant interior and exterior sidewalls, the inter-gate dielectric layer in the non-gate region 160 also has slant surfaces. Hence, the vertical etching thickness of the inter-gate dielectric layer in the non-gate region 160 is reduced. Such reduction in the vertical etching thickness in the inter-gate dielectric layer enables the inter-gate dielectric layer in the non-gate region 160 to be easily removed.

The dielectric layer 152 can be, for example, a silicon nitride layer, a silicon oxide layer, an oxide/nitride/oxide composite layer, lead-zirconium-titanium acid salt layer, bismuth-strontium-titanium acid salt layer or tantalum oxide layer. The conductive layer 124 includes at least one conductive layer. The conductive layer 124 can be, for example, a polysilicon layer or a tungsten silicide layer.

Figure 6A:
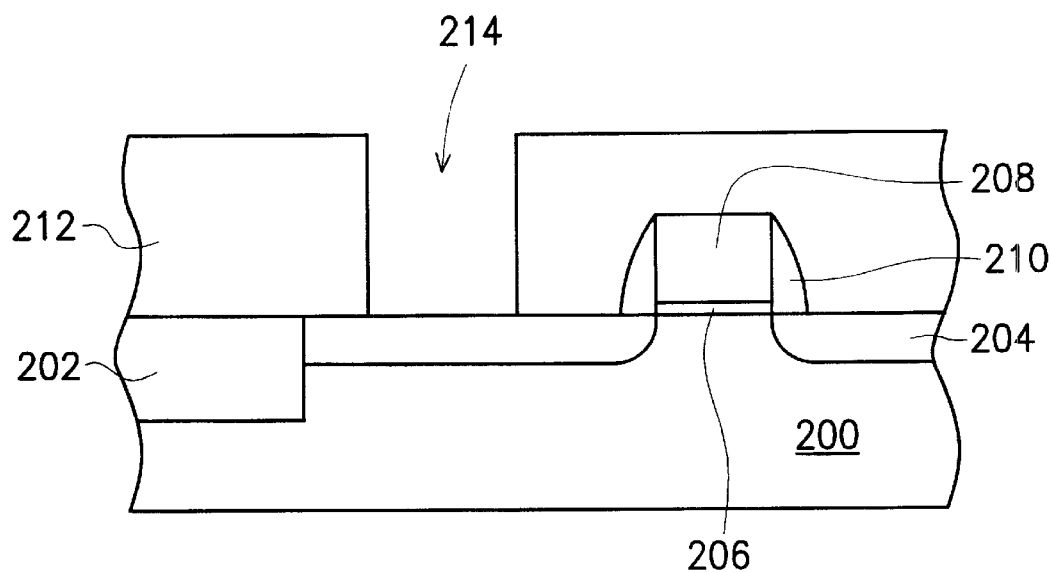
FIGS. 6A through 6G are cross-sectional views showing the progression of steps for producing the capacitor of a dynamic random access memory according to this invention.

FIGS. 6A through 6G are cross-sectional views showing the progression of steps for producing the capacitor of a dynamic random access memory according to this invention. First, as shown in FIG. 6A, a semiconductor substrate 200 is provided. An isolation region 202 is formed in the semiconductor substrate 200 to mark out the active region for forming devices. A dynamic random access memory (DRAM) transistor is formed over the semiconductor substrate 200. The transistor includes a pair of source/drain terminals 240, a gate dielectric layer 206, a gate 208 and spacers 210. A dielectric layer 212 is formed over the substrate 200. The dielectric layer 212 has a via opening 214 that exposes one of the source/drain terminals 204 of the transistor.

Figure 6B:
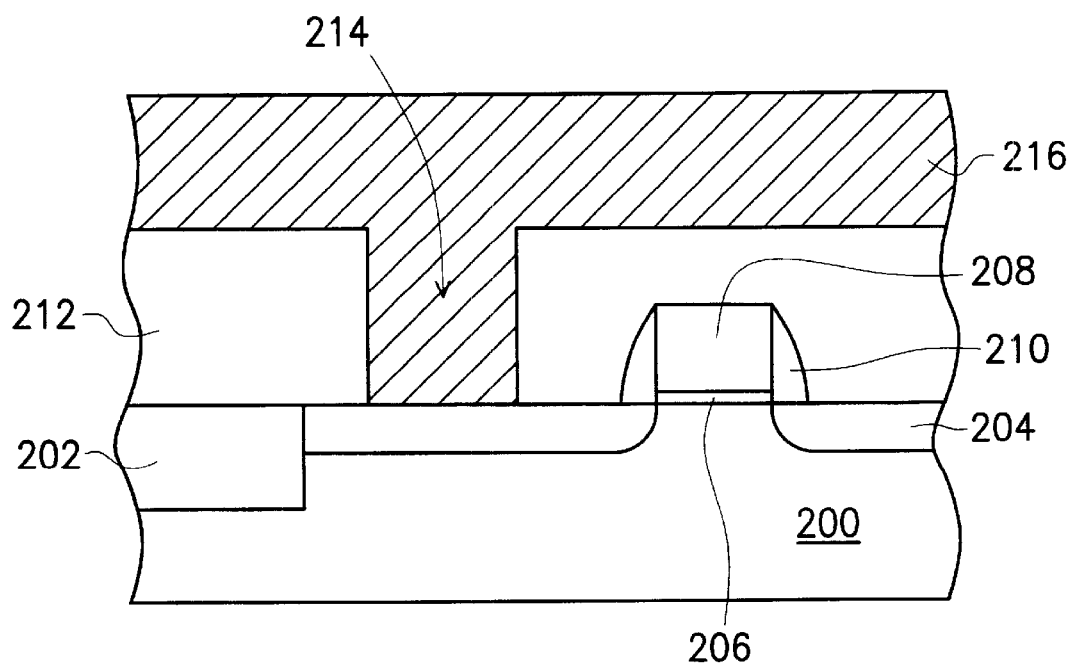

As shown in FIG. 6B, a conductive layer 216 is formed over the dielectric layer 212. The conductive layer 216 completely fills the via opening 214. The conductive layer 216 can be a polysilicon layer, for example.

Figure 6C:
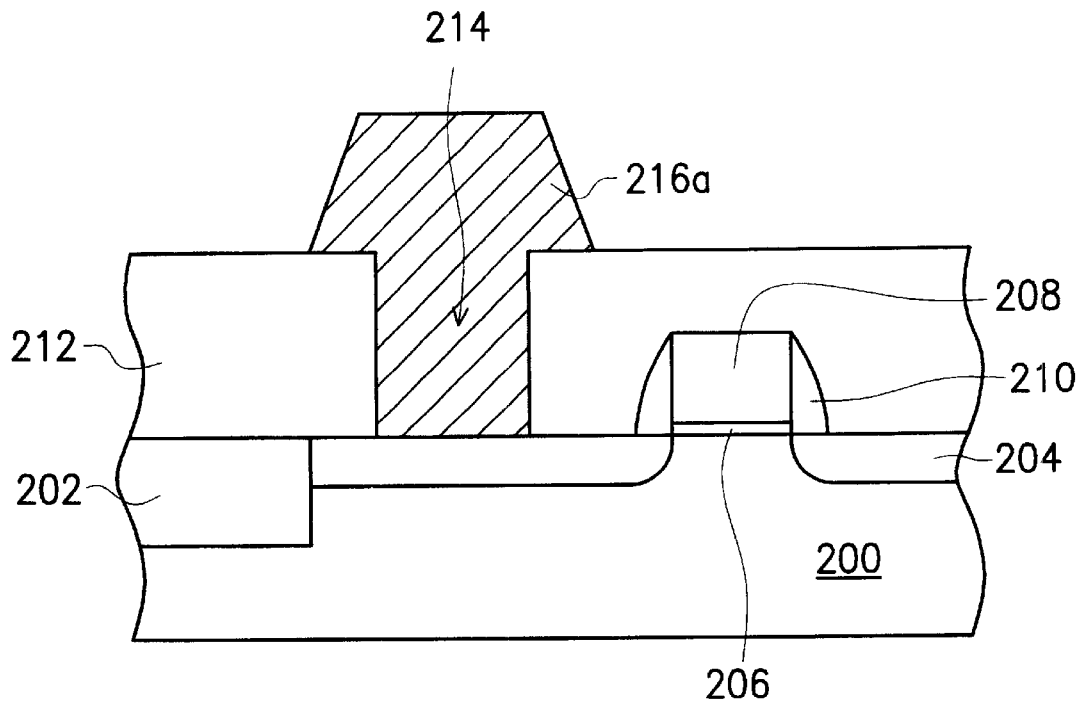

As shown in FIG. 6C, the conductive layer 216 is patterned to expose the dielectric layer 212 outside the via opening 214, thereby forming a conductive layer 216a. The conductive layer 216a at least fills the via opening 214 completely. The conductive layer 216a has slant external sidewalls. The slant sidewall is formed at slant angle of 60° to 90° with respect to a top surface of the dielectric layer 212. The conductive layer 216a, for example, may also cover a portion of the dielectric layer 212 around the via opening 214.

Figure 6D:
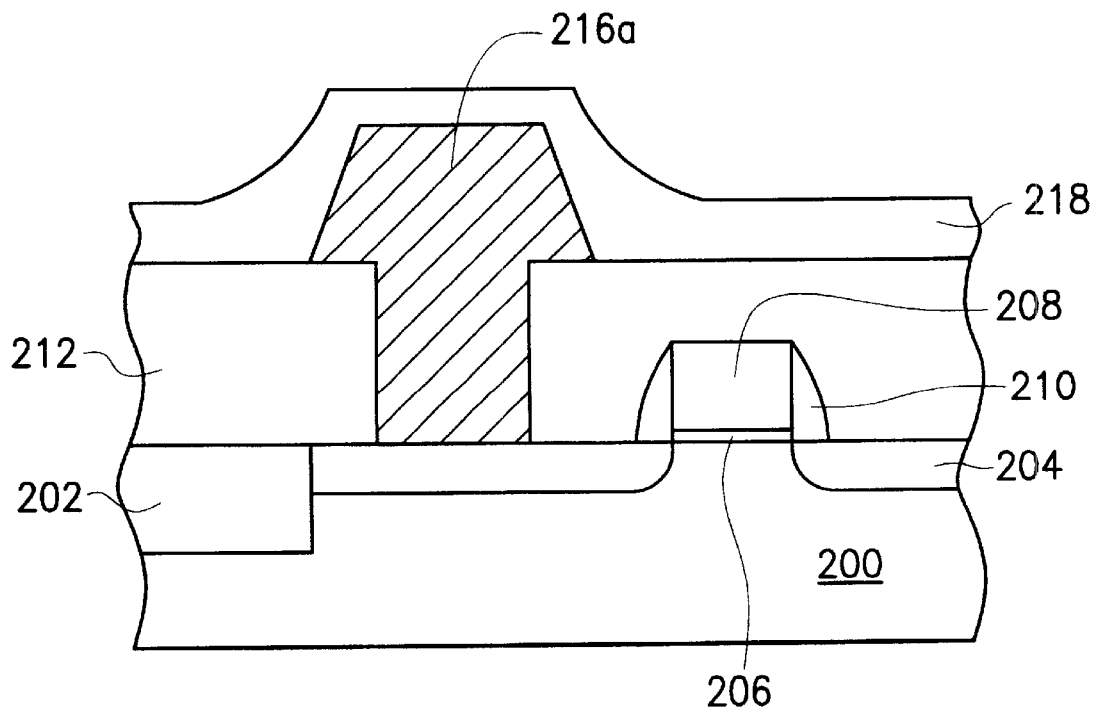

As shown in FIG. 6D, a mask layer 218 is formed over the conductive layer 216a. The mask layer 218 can be, for example, a photoresist layer, a spin-on glass layer, an oxide layer, a silicon nitride layer, an ion-containing oxide layer, an ion-containing silicon nitride layer, a boron-silicate glass layer or a silicon-oxygen containing organic layer. If the mask layer is a spin-on glass layer, a densification step needs to be carried out after spin-coating the glass material onto the conductive layer 216a.

Figure 6E:
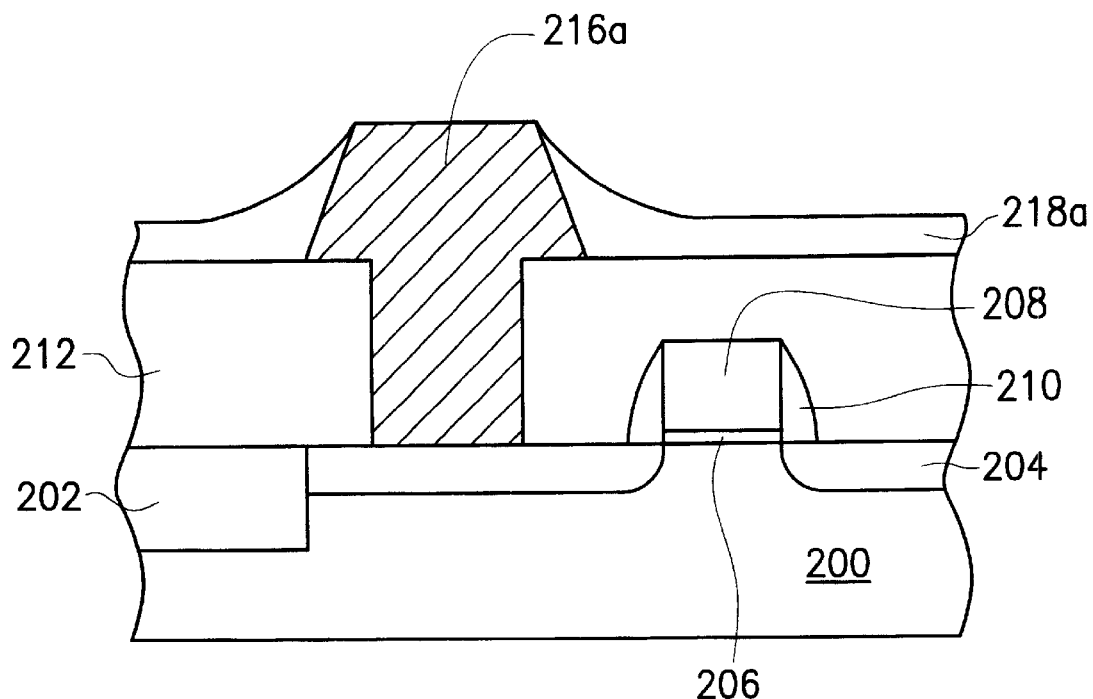

As shown in FIG. 6E, a portion of the mask layer 218 is removed and the upper surface of the conductive layer 216a is exposed by planarization to form a mask layer 218 a. The planarization step can be back etching or chemical-mechanical polishing, for example. If the mask layer 218 is formed from one of the materials including oxide, silicon nitride, ion-containing oxide, ion-containing silicon nitride, boron-silicate glass, borophosphosilicate glass, boron-containing oxide, phosphorus-containing oxide, boron-phosphorus-containing oxide and silicon-oxygen organic silicate, back etching or chemical-mechanical polishing may be used to perform the planarization. On the other hand, if the mask layer 218 is a photoresist or a spin-on glass layer, back etching is preferably used to perform the planarization.

Figure 6F:
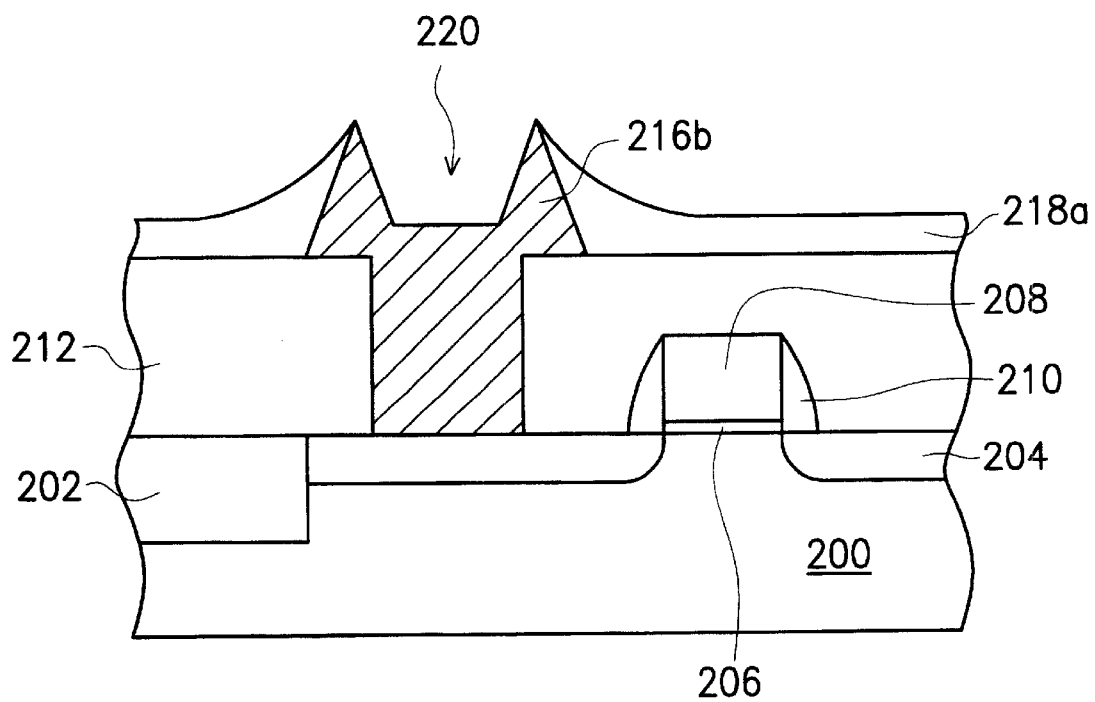

As shown in FIG. 6F, an anisotropic slant angle etching is carried out etching the conductive layer 216a using the mask layer 218a as a mask to a pre-defined depth. Hence, an opening 220 is formed over the conductive layer 216a. The anisotropic slant angle etching produces interior sidewalls with a slant angle ranging between 60° to 90° relative to the horizontal. The pre-defined depth of the opening 220 is at least 30% of the thickness of the conductive layer 216a above the dielectric layer 212.

Figure 6G:
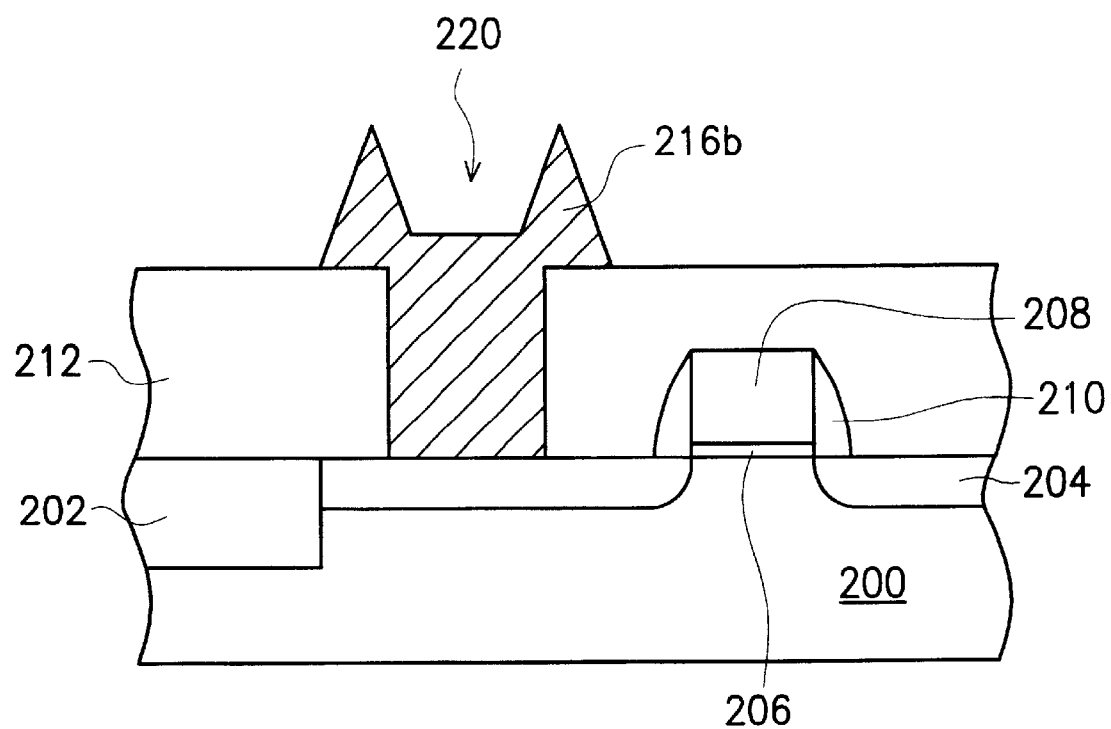

As shown in FIG. 6G, the mask layer 218a is removed to expose the conductive layer 216b, thereby forming the lower electrode of a dynamic random access memory (DRAM) capacitor.

The conductive layer 216a has slant external sidewalls and hence the mask layer 218a is able to cover the slant external sidewalls completely. Therefore, the mask layer 218a can serve as a mask layer in the anisotropic etching step to form the lower electrode without using another photomask to pattern the lower electrode. A photomask is thereby saved.

Since a conventional stacked type capacitor is limited by shape, overall charge-storing surface area is minimal. In the embodiment of this invention, the conductive layer 216b has a conductive opening 220. The cylindrical or ring-like conductive layer 216b is capable of increasing charge-storing surface area and hence capacitance of the capacitor.

In summary, major aspects in the method of forming a transistor gate in this invention includes:

1. In this invention, the mask layer is used as an etching mask in an anisotropic etching to form an opening in a conductive layer with slant external sidewalls on the upper section of a floating gate. The mask layer exposes the upper surface of the conductive layer and covers the dielectric layer not covered by the conductive layer. The mask layer also covers the slant external sidewalls of the mask layer. Hence, the mask layer can serve as an etching mask in an anisotropic slant etching operation to form the upper section of the floating gate. Since there is no need to pattern using another photomask, one photomask fabrication step is saved.
2. The upper section of the floating gate has an opening. Hence, the invention is able to provide extra surface area through the slant interior and exterior sidewalls around the opening.
3. When another gate is formed over the upper section of the floating gate, surface area of the inter-gate dielectric layer is increased and vertical etching thickness of the inter-gate dielectric layer in the non-gate region is reduced. Thus, overall effective surface area of the inter-gate dielectric layer is increased.
4. Performance of the transistor gate is improved through an increase in capacitance between the floating gate and the control gate.
5. The method can be similarly applied in the fabrication of dynamic random access memory (DRAM) capacitor to increase the effective surface area of a capacitor dielectric layer, thereby increasing the capacitance of the capacitor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a transistor gate on a substrate having a gate dielectric layer above the substrate, a lower section floating gate above the gate dielectric layer, a source/drain terminal in the substrate on each side of the lower section of the floating gate and a first dielectric layer over the substrate with a via opening that exposes a portion of the lower section of the floating gate, comprising the step of:

forming a conductive material over the first dielectric layer, wherein the conductive material completely fills the via opening;

patterning the conductive material to form a first conductive layer, wherein the first conductive layer at least completely fills the via opening and the first conductive layer has slant external sidewalls;

forming a mask material layer covering the first conductive layer;

performing a planarization operation to remove a portion of the mask material layer and form a first etching mask layer, wherein the upper surface of the first conductive layer is also exposed alter the planarization operation;

subsequently performing an anisotropic slant etching operation using the first etching mask layer as a mask on a top of the first conductive layer to form an opening with slant inner sidewalls in the first conductive layer, wherein the anisotropic etching operation etches at least 30% of the thickness of the conductive layer above the dielectric layer.

2. The method of claim 1, wherein the conductive layer includes a polysilicon layer.

3. The method of claim 1, wherein material constituting the mask material layer is selected from a group consisting of photoresist, spin-on glass, oxide, silicon nitride, ion-containing oxide, ion-containing silicon nitride, boron-silicate glass, borophosphosilicate glass, boron-containing oxide, phosphorus-containing oxide, boron-phosphorus-containing oxide and silicon-oxygen containing organic material.

4. The method of claim 1, wherein the step of patterning the conductive material layer including forming slant exterior sidewalls having a slant angle of between 60° to 90° with the horizontal.

5. The method of claim 1, wherein the step of performing anisotropic slant etching includes forming sidewalls with a slant angle of between 60° to 90° with the horizontal.

6. The method of claim 1, wherein the first conductive layer also covers the first dielectric layer around the via opening after the conductive material layer is patterned.

7. The method of claim 1, wherein the upper section of the floating gate includes a polysilicon layer.

8. The method of claim 1, wherein the step of forming the transistor gate further includes the steps of:

forming a second dielectric layer over the substrate conformal of the upper section of the floating gate;

forming at least a second conductive layer over the second dielectric layer;

forming a patterned second etching mask layer over the second conductive layer, wherein the pattern runs across a portion of the upper section of the floating gate;

performing an anisotropic etching operation using the second etching mask layer sequentially etching the second conductive layer, the second dielectric layer, the upper section of the floating gate and the lower section of the floating gate so that a portion of the first dielectric layer and the gate dielectric layer under the lower section of the floating gate are exposed, wherein an inter-gate dielectric layer is formed over the upper section of the floating gate after the second dielectric layer is etched and at least a control gate structure above the inter-gate dielectric layer after the second conductive layer is etched; and removing the second etching mask layer.

9. The method of claim 1, wherein material constituting the gate dielectric layer is selected from a group consisting of silicon nitride, silicon oxide, oxide/nitride/oxide composite, lead-zirconium-titanium acid salt, bismuth-strontium-titanium acid salt and tantalum oxide.

* * * * *